United States Patent [19]
Fisch

[11] Patent Number: 6,037,827
[45] Date of Patent: Mar. 14, 2000

[54] NOISE ISOLATION CIRCUIT

[75] Inventor: David Fisch, Tateyama, Japan

[73] Assignees: United Memories, Inc., Colorado Springs, Colo.; Nippon Steel Semiconductor Coporation, Chiba, Japan

[21] Appl. No.: 08/883,938

[22] Filed: Jun. 27, 1997

[51] Int. Cl.[7] .................................................. H03K 19/00
[52] U.S. Cl. ............................ 327/379; 327/206; 326/27
[58] Field of Search .................................. 327/205, 206, 327/379, 384, 387, 389, 391, 108, 112; 326/23, 24, 26, 27, 83, 87

[56] References Cited

U.S. PATENT DOCUMENTS

| | | | |
|---|---|---|---|
| 4,539,489 | 9/1985 | Vaughn | 327/205 |
| 4,818,901 | 4/1989 | Young et al. | 326/27 |
| 5,500,817 | 3/1996 | McLaury | 365/189.05 |
| 5,696,719 | 12/1997 | Baek et al. | 365/189.05 |

FOREIGN PATENT DOCUMENTS

| | | | |
|---|---|---|---|
| 58-184815 | 10/1983 | Japan | 327/206 |
| 6-61818 | 3/1994 | Japan | 327/384 |

*Primary Examiner*—Tuan T. Lam
*Attorney, Agent, or Firm*—Stuart T. Langley; William J. Kubida; Hogan & Hartson LLP

[57] ABSTRACT

A receiver circuit for an integrated circuit including an input buffer having an input coupled to receive an external input signal and an output coupled to generate a buffered input signal in response to the external input signal. The input buffer is selectively enabled by a control signal. A latch is coupled to receive the buffered input signal and to generate a latched output signal. A delay circuit is coupled to receive the latched output signal and to generate a delayed signal. A comparator is coupled to receive both the latched output signal and the delayed signal. The comparator has an output coupled to the input buffer to generate the control signal.

15 Claims, 6 Drawing Sheets

NOISE ISOLATION CIRCUIT

BACKGROUND OF THE INVENTION

1. Field of the Invention

The present invention relates, in general, to input/output (I/O) circuits, and, more particularly, to an I/O circuit that is isolated from noise occurring at a predictable time after a state change.

2. Relevant Background

Digital circuits receive and process logic signals. These logic signals comprise two or more "states" or logic levels where each state is typically represented by a unique voltage. Most digital circuits are binary having two states (i.e., logic HIGH and logic LOW) represented by two voltages. To conserve power, increase circuit density on chips and increase switching speed of the logic circuits, there is a trend to reduce the span between the two voltages. Commonly available circuits use 3.3 V and 0.0 V power supply busses allowing a span between logic levels of around 3 V.

A fundamental capability of any logic circuit is its ability to distinguish or discriminate between the voltage representing each of the logic states. In the case of binary logic, the logic signals can theoretically be distinguished by comparison to a reference the span between logic level voltages decreases, however, this comparison becomes more problematic. Also, when more than two logic levels are used, the difference between adjacent logic level voltages is difficult to distinguish. In these circuits, the logic level discriminator becomes increasingly sensitive to noise, particularly noise that affects the voltage on the power supply busses.

For example, in a dynamic random access memory (DRAM) circuit, an entire row of memory cells is addressed at one time using a row address line. Each row address line extends across a memory chip to hundreds of memory circuits. The row address line has significant capacitance and the memory circuits themselves are a significant capacitive load. Hence, the row address operation causes significant current flow in the power supply bus wiring and corresponding current resistance (IR) voltage loss in the bus wiring. The voltage loss results in incorrect discrimination between logic levels for a brief period of time after the row address signal occurs unless steps are taken to ensure that the power supply busses are not loaded by the signal transition.

Previous circuits attempt to solve the bus loading problem by independently routing power ($V_{DD}$) and ground ($V_{SS}$) bussing about the integrated circuit. In this manner, circuits that are used to discriminate logic levels are coupled to voltage supply busses that are separate from the loaded supply busses. However, independent routing consumes more chip area resulting in larger, more costly chips. Also, independent routing can reduce overall power and ground effectiveness.

Another solution is to use Schmitt triggers in the discriminator circuits. A Schmitt trigger is essentially a comparator with hysteresis. Schmitt triggers, however, merely reduce noise sensitivity, not eliminate it. Because they introduce hysteresis they reduce the input level margin making them less effective as the voltage span between logic levels decreases.

Another solution is to use "de-glitch" or "de-bounce" circuits. These circuits essentially add a delay in series with the input before a valid output signal is made available. For example, in a memory circuit a de-glitch circuit would not make a data output valid until after a delay sufficient for the power supply busses to stabilize. While these circuits ensure valid data output, they by definition add delay and slow response of the system. Hence, a need remains for a input/output circuit that is insensitive to noise yet does not add excessive delay or decrease the input level margin.

SUMMARY OF THE INVENTION

The present invention involves a receiver circuit for an integrated circuit including an input buffer having an input coupled to receive an external input signal and an output coupled to generate a buffered input signal in response to the external input signal. The input buffer is selectively enabled by a control signal. A latch is coupled to receive the buffered input signal and to generate a latched output signal. A delay circuit is coupled to receive the latched output signal and to generate a delayed signal. A comparator is coupled to receive both the latched output signal and the delayed signal. The comparator has an output coupled to the input buffer to generate the control signal.

The present invention also involves a method for receiving a signal in an integrated circuit. The received signal is amplified by an amplifier and coupled to a latch. The amplifier is de-coupled from the latch in response to a change in state of the latched signal. After a preselected duration of time, the amplifier is re-coupled to the latch.

DETAILED DESCRIPTION OF THE PREFERRED EMBODIMENTS

The present invention involves a noise isolation circuit that functions to latch valid data when it is first available and to prevent the latched output from changing during time periods where noise is expected. Such expected noise occurs in circuits when the power supplies are loaded at predictable times. However, the present invention is applicable to any circuit or situation in which the predictable noise event occurs for a known duration after the signal changes state.

The present invention is used in the receiver portion of an input/output (I/O) device. When used as an input, the circuit in accordance with the present invention isolates selected circuitry from noise created from a previous stage. When used as an output, the circuit in accordance with the present invention isolates external circuitry from noise created internal to the chip. These applications are substantially equivalent.

Figure 1:
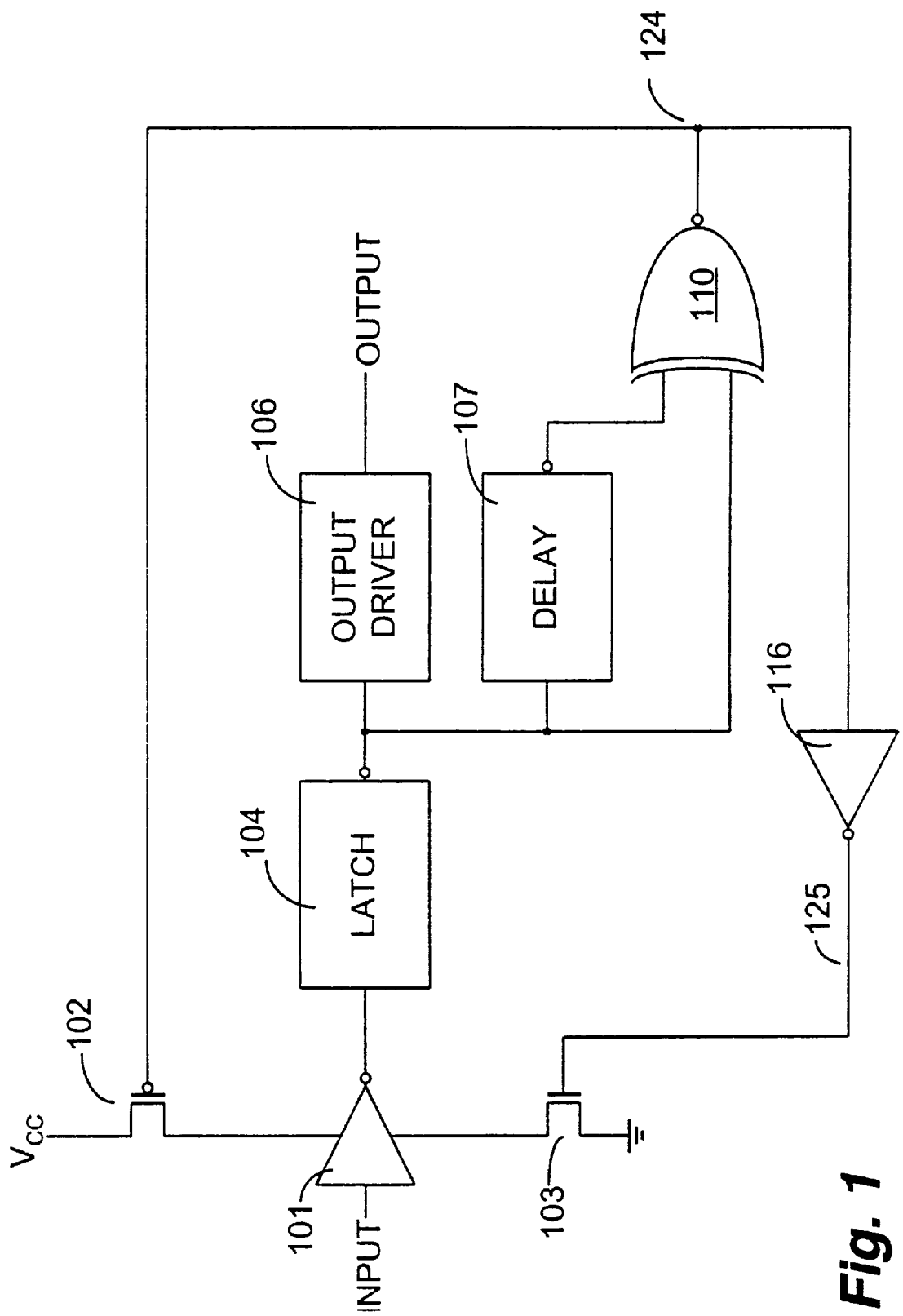
FIG. 1 illustrates in block diagram form a noise isolation circuit in accordance with the present invention.

FIG. 1 illustrates an embodiment in accordance with the present invention in block diagram form. An input buffer 101 is coupled to receive an external input signal. Input buffer 101 has power nodes that are coupled to a first power supply VCC and a second power supply that is at ground potential in FIG. 1. The second power supply is referred to as VSS and may be a negative voltage in some systems. In conventional circuits, buffer 101 is coupled directly to the power supplies so that it receives a constant source of power and remains constantly enabled and operative. In accordance with the present invention, however, a first switch 102 is coupled in series between a power node of buffer 101 and the first power supply VCC. A second switch 103 is coupled in series with a second power node of buffer 101 and the VSS power supply. VCC is typically a positive power supply while VSS is negative or ground. In typical applications, VDD is 5 volts or 3.3 volts while VSS is ground.

Input buffer 101 is shown as an inverting amplifier although other input buffer circuitry is known and may be equivalent to the particular embodiment shown. Throughout the description of the preferred embodiment, specific polarities are noted and inverting or non-inverting outputs and inputs to each of the devices are shown, although, it should be understood that inversion is a matter of design choice and may or may not be used so long as the output functionality is achieved.

The output of input buffer 101 is coupled to latch 104. Buffer 101 includes output drivers that have sufficiently low impedance to change the state of latch 104. Latch 104 is asynchronous as it does not require a clock signal and serves to latch whatever signal is applied by buffer 101 when buffer 101 is enabled. However, when switches 102 and 103 are turned off, buffer 101 is disabled and cannot drive or change the state of latch 104. In this case, latch 104 will remain in its existing state until input buffer 101 is re-enabled.

The output of latch 104 is coupled to an output driver 106 that includes amplifier circuitry sufficient to drive the output signal onto external circuitry (not shown). Output driver 106 also provides the correct polarity for the output signal such that the output matches the input polarity.

The output of latch 104 is also coupled to a control circuit formed by delay 107 and comparison circuit 110. Delay circuit 107 provides or generates a delayed version of the latched signal on its output. In the preferred embodiment, delay circuit 107 also inverts the latch signal such that in steady state the input to comparison circuit 110 is always the same. Comparison circuit 110 comprises combinatorial logic that, in the preferred embodiment, generates a logic high when both of the inputs to comparison circuit 110 are the same. Comparison circuit 110 generates a logic low when the binary states of the inputs differ from each other. Generally, comparison circuit 110 provides an exclusive-or type function with an inverted output. Comparison circuit 110 outputs a control signal on node 124 that is coupled to switch 102. The control signal on node 124 is also coupled through inverter 116 to switch 103 via node 125.

In operation, as the input to buffer 101 changes, the new signal is latched and held in latch 104. Delay circuit 107 ensures that the inputs to comparison circuit 110 have different logic states for some preselected time period (determined by delay 107) after the output of latch 104 changes. Comparison circuit 110 then generates a control signal 124 that deactivates switch 102 during the preselected time period. Similarly, the inverted control signal on line 125 turns off switch 103 during the preselected time period. Hence, during the preselected time input buffer 101 is deactivated or disabled and cannot change the output of latch 104 or output driver 106. The delay provided by delay circuit 107 is selected to be of sufficient duration to allow any power fluctuations on the VDD or VSS power supply buses to stabilize.

Figure 2:
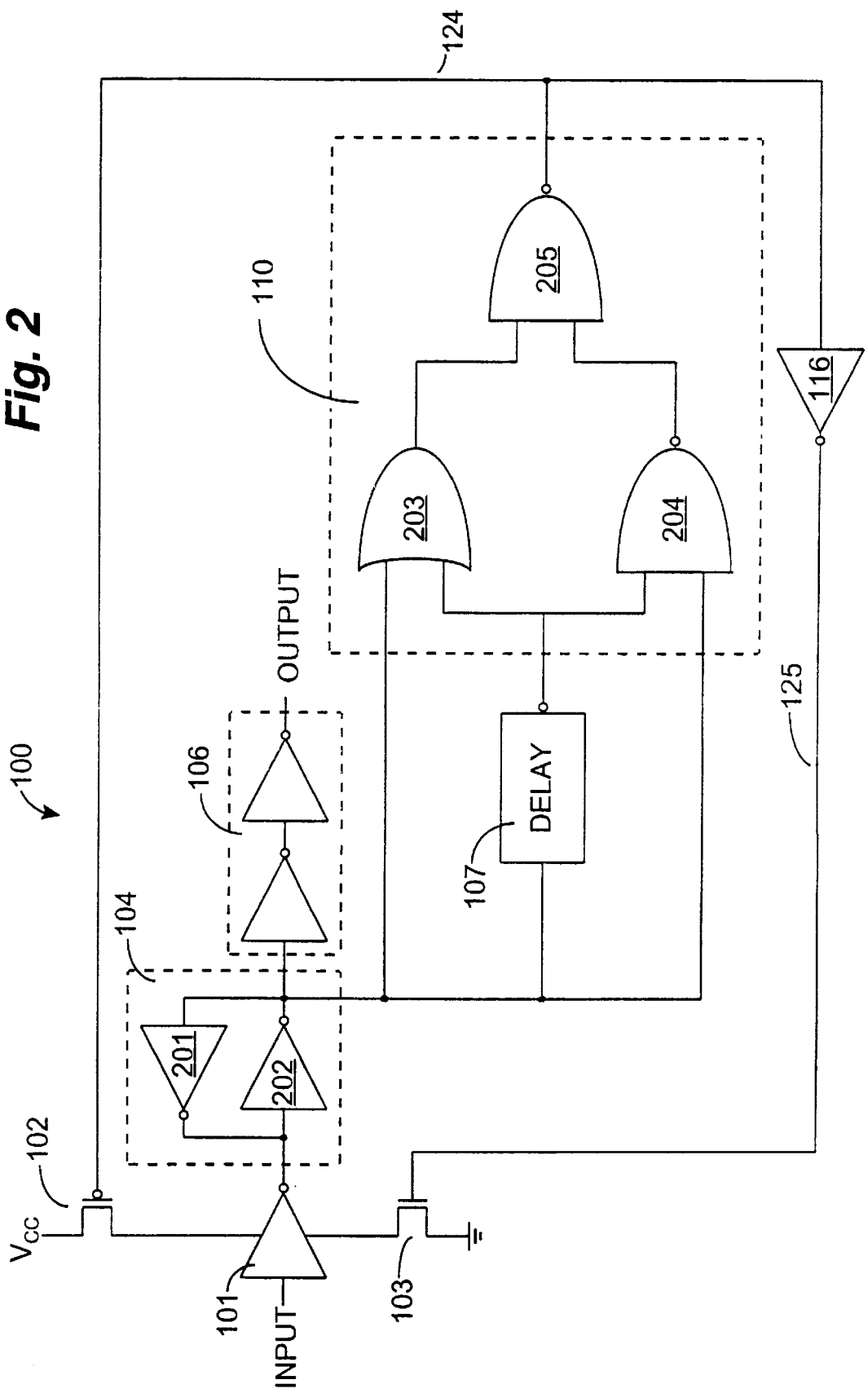
FIG. 2 illustrates a logic circuit diagram implementing the embodiment shown in FIG. 1.

FIG. 2 shows the circuit of FIG. 1 at a gate-level logic diagram. Latch 104 is conveniently provided by a pair of inverters 201 and 202 coupled in a regenerative circuit. Advantageously, inverter 201 is a weak inverter as compared to inverter 202. This arrangement allows input buffer 101 to drive a signal onto the latch only when buffer 101 is enabled while making latch 104 insensitive to changes in the output of buffer 101 when buffer 101 is disabled. In a specific implementation, output buffer 106 comprises a pair of series coupled inverters sized to provide the required output impedance.

Figure 3:
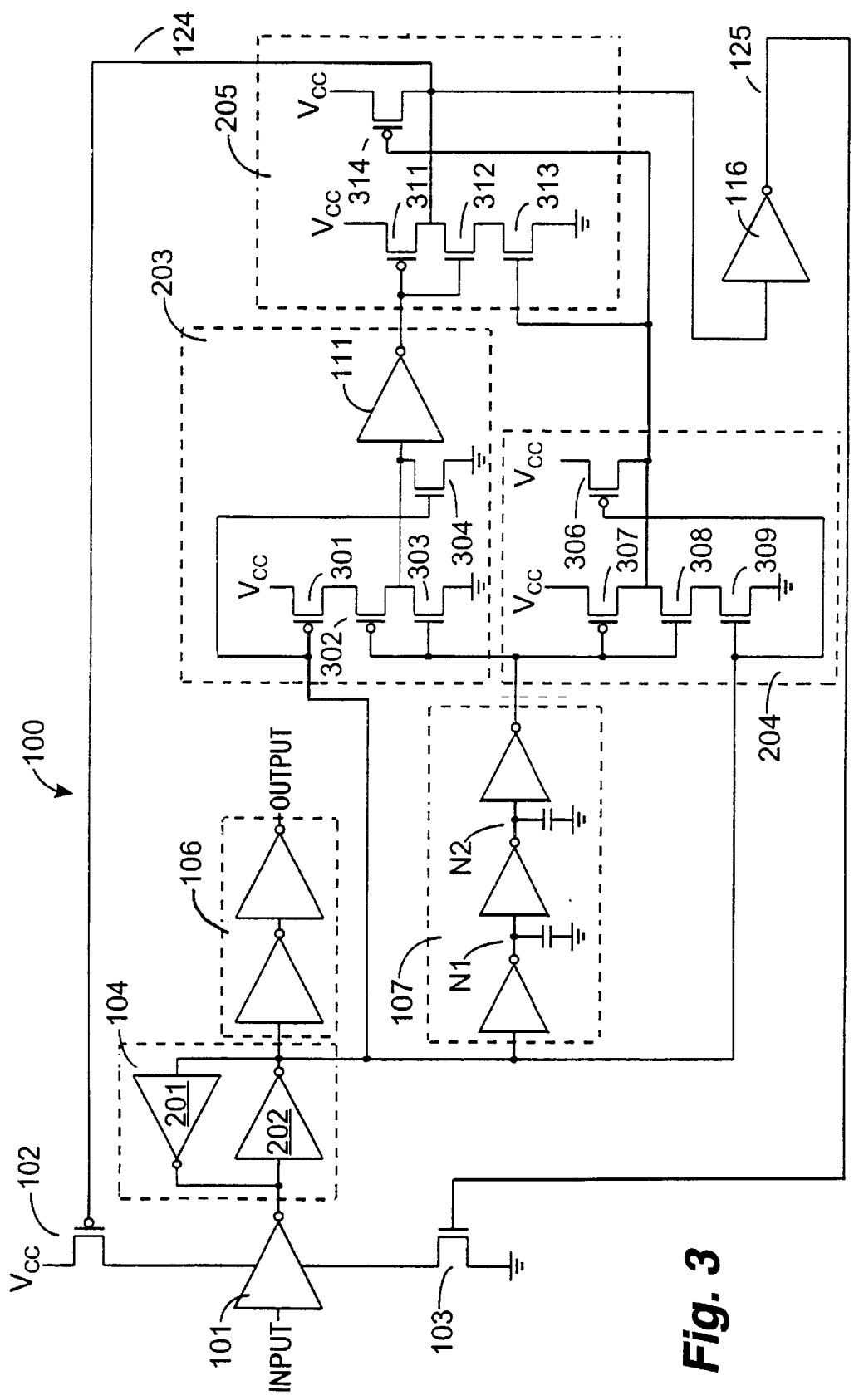
FIG. 3 illustrates a schematic diagram implementing the logic circuit of FIG. 2.

Comparison circuit 110 is conveniently formed by an OR gate 203 that receives the delayed signal from delay 107 and the latched signal from latch 104. A NAND gate 204 also receives the delayed signal from delay 107 and the latched signal from latch 104. The outputs of gates 203 and 204 are coupled as inputs to NAND gate 205. The output of gate 205 is coupled to node 124. The logic circuit implementing comparison circuit 110 shown in FIG. 2 is an example only and illustrates one practical circuit for implementing the combinatorial logic described above. However, equivalent circuits are known and may be more desirable depending on the particular logic technology used. As shown in FIG. 3, the present invention is intended to be implemented using CMOS technology. The gates chosen in FIG. 2 are chosen primarily to simplify the circuitry for implementation in CMOS technology.

As shown in FIG. 3, delay circuit 107 is implemented as a plurality of series coupled inverters. In the preferred embodiment an odd number of inverters are used so that the steady state output of delay 107 is inverted as compared to the steady state output of latch. This may be changed if desired with appropriate modifications to the remaining circuitry. Any number of delay stages may be used in delay circuit 107 to provide any desired delay so long as input buffer 101 is re-enabled in sufficient time to receive the next signal.

OR gate 203 is formed by a CMOS NOR gate comprising transistors 301, 302, 303 and 304. The gates of transistors 301 and 304 are coupled to the output of latch 104. The gates of transistors 302 and 303 are coupled to the output of delay circuit 107. The output of CMOS NOR gate is coupled from the drain of 304 to the input of CMOS inverter 111. The details of CMOS 111 are not shown and are well known in the industry.

NAND gate 204 is formed by transistors 307, 308, 309 and 306. The gates of transistors 307 and 308 are coupled to the output of delay circuit 107. The gates of transistors 306 and 309 are coupled to the output of latch 104. The output of NAND gate 204 is coupled to the input of NAND gate 205. NAND gate 205 comprises transistors 311, 312, 313 and 314. One input of NAND gate 205 is formed by the gates of transistors 311 and 312, while the second input of NAND gate 205 is formed by the gates of transistors 313 and 314. The output of NAND gate 205 is node 124 that is coupled back to switch 102 to provide a negative going control signal to switch 102.

Switch 102 is a p-channel transistor in the preferred embodiment and so is on while a logic low signal is applied to line 124. Switch 103 comprises an n-channel transistor that is on while a logic high signal is applied to node 125. Circuit 100 shown in FIG. 3 generates a logic low on node 124 and a logic high on node 125 during steady state (i.e., while both the input and delayed input have the same logic value), with opposite states for the preselected period of time after the input to buffer 101 changes state.

Figure 4:
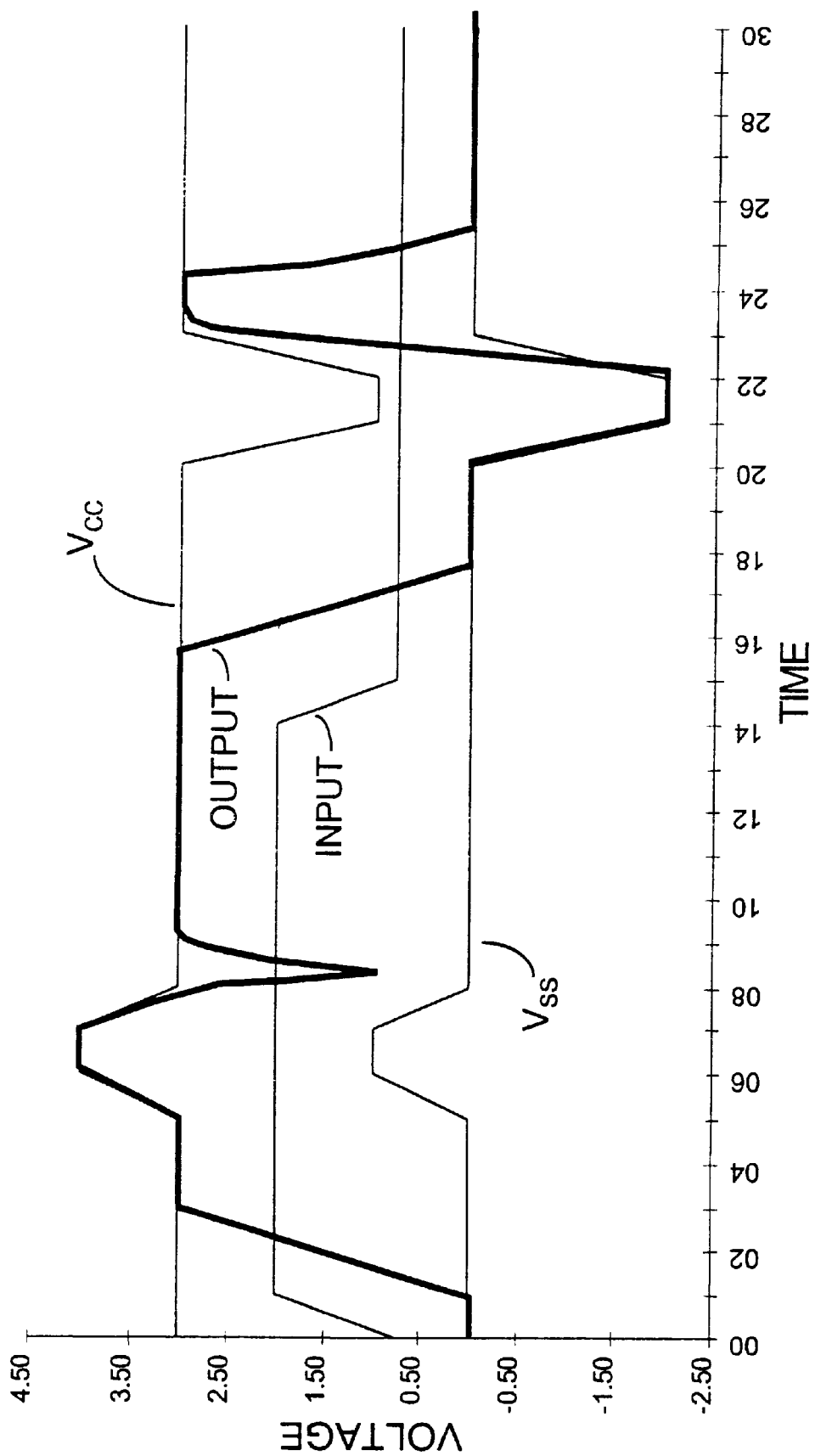
FIG. 4 illustrates a timing diagram of a prior art logic circuit.
Figure 5:
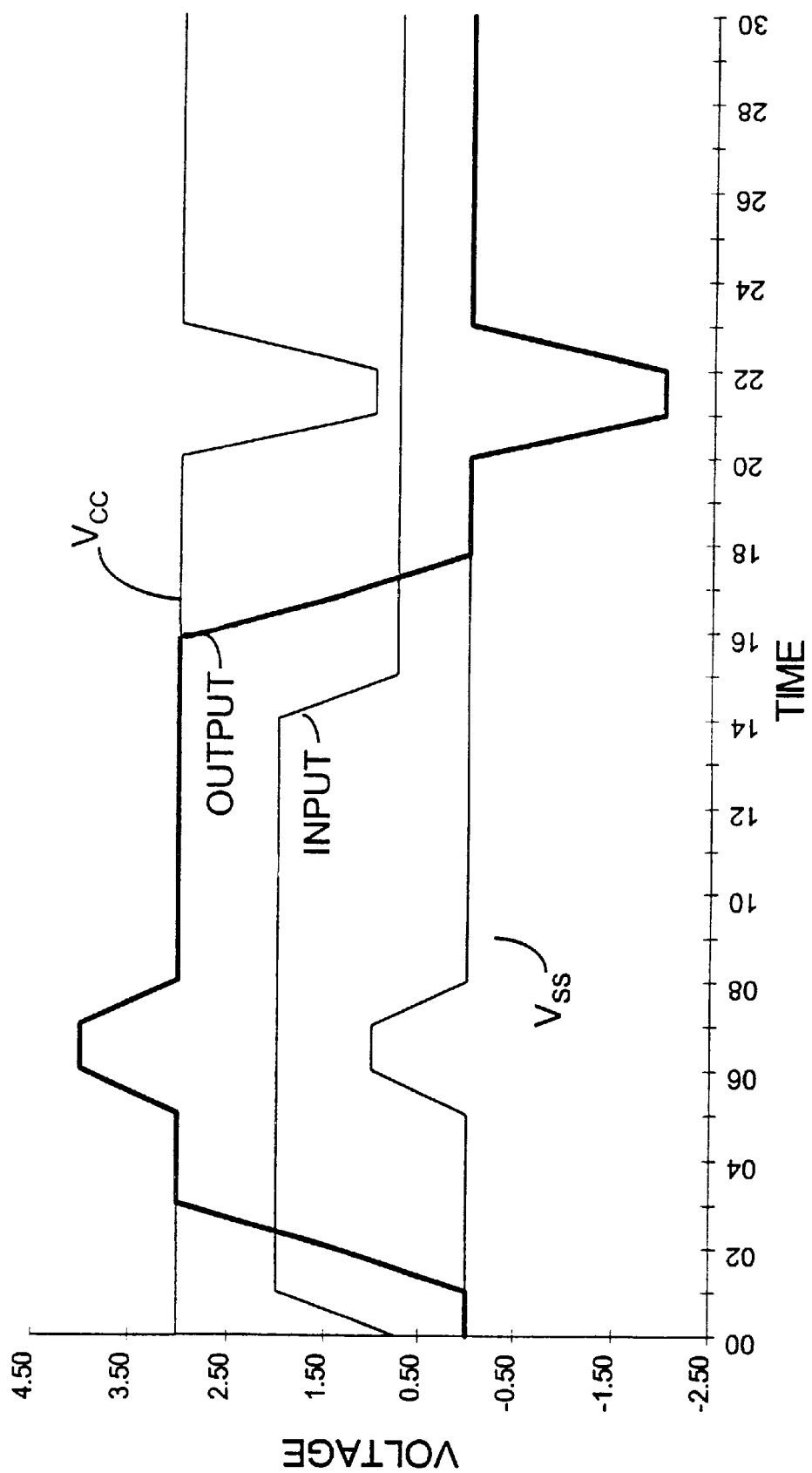
FIG. 5 illustrates a timing diagram of a circuit in accordance with the present invention.
Figure 6:
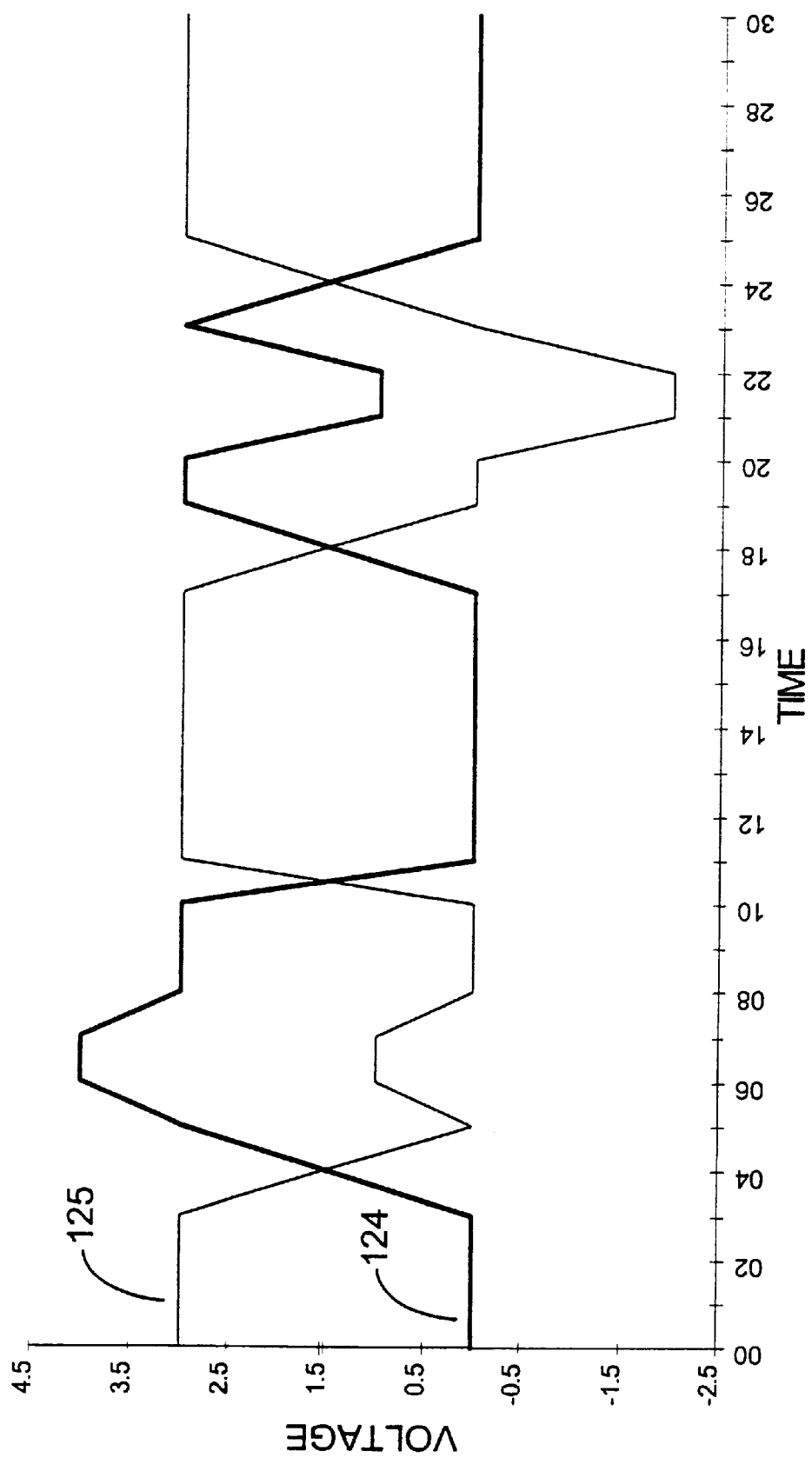
FIG. 6 illustrates a timing diagram of exemplary control signals generated by a circuit in accordance with the present invention.

FIG. 4–FIG. 6 illustrate wave diagrams showing advantages of the noise isolation circuit in accordance with the present invention. FIG. 4 is a prior art device without noise immunity. In each of FIG. 4–FIG. 6 the horizontal axis represents time and the vertical axis represents voltage. At time 01 the input signal Vin has completed changing from a logic low to a logic high. After a short duration to time period 03, the output signal, shown in bold, approaches a logic high level also. At approximately time 05 a noise spike occurs on the power supply buses forcing the VSS power supply to approximately 1 volt and the VCC power supply to approximately 4 volts. It can be seen that during this time period the input signal Vin is much closer to VSS than VCC. This results in an incorrect determination of the logic level of Vin forcing the output to suddenly switch to a logic low at time 08. Once the power supply spike has stabilized, Vout again returns to the correct logic value.

At approximately time 20, a negative going noise pulse on the power supply lines occurs. During this power spike the Vin is much closer to VCC than to VSS resulting in incorrect discrimination of the logic level of Vin. Vout responds by spiking upwards to a logic high until the power supply noise subsides. After the power supply noise stabilizes, Vout returns to the correct value.

FIG. 5 illustrates a corrected, noise-immune waveform generated by circuit 100 in accordance with the present invention. By comparison of FIG. 4 and FIG. 5, it is readily apparent that the power supply noise occurring at times 05 and 20 does not affect the output voltage of Vout. As shown in FIG. 6 the signals generated by circuit 100 on nodes 124 and 125 are responsible for the superior performance and noise immunity shown in FIG. 5. At time 03 simultaneously with the output changing, the control signal on line 124 drops to a logic low while the control signal on line 125 rises to a logic high. This results in deactivating switches 102 and 103 and disabling input buffer 101. Input buffer 101 remains disabled in the example shown in FIG. 6 until approximately time 11. After time 11 sufficient time has lapsed since at the power supply voltages are stable.

Similarly, during the negative going voltage supply spikes the control signal on line 125 drops to a logic low while the control signal on line 124 goes to a logic high simultaneously with the output voltage change, thereby disabling input buffer 101. Input buffer 101 remains disabled during the supply voltage spike resulting in correct output voltage from the circuit in accordance with the present invention.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

I claim:

1. A receiver for an integrated circuit comprising:
   an input buffer having an input coupled to receive an external input signal and an output coupled to generate a buffered input signal in response to the external input signal, wherein the input buffer is selectively enabled by a control signal;
   a latch coupled to receive the buffered input signal and to generate a latched output signal;
   a delay circuit coupled to receive the latched output signal and an output coupled to generate a delayed signal; and
   a comparator having inputs coupled to receive both the latched output signal and the delayed signal, the comparator having an output coupled to the input buffer to generate the control signal.

2. The receiver of claim 1 further comprising:
   an output driver circuit coupled to receive the latched output signal and an output coupled to generate an output to external circuitry.

3. The receiver of claim 1 wherein the input buffer comprises:
   a CMOS inverter;
   a first switch coupled between the CMOS inverter and a $V_{DD}$ voltage supply, the first switch having a control electrode for receiving the control signal; and
   a second switch coupled between the CMOS inverter and a $V_{SS}$ voltage supply, the second switch having a control electrode for receiving the control signal.

4. The receiver of claim 1 wherein the input buffer comprises:
   a first CMOS inverter having an input coupled to receive the external input signal and an output coupled to generate the buffered input signal;
   a P-channel FET coupled between the CMOS inverter and a $V_{DD}$ voltage supply, the P-channel FET having a gate electrode for receiving the control signal;
   a second CMOS inverter having an input coupled to receive the control signal and an output coupled to generate an inverted control signal; and
   an N-channel FET coupled between the CMOS inverter and a $V_{SS}$ voltage supply, the N-channel FET having a gate electrode for receiving the inverted control signal.

5. The receiver of claim 1 wherein the delay circuit comprises a plurality of series coupled CMOS inverters.

6. The receiver of claim 1 wherein the comparator comprises a two input exclusive-or gate having a first input coupled to the delayed signal, a second input coupled to the latched output signal, and an inverting output providing the control signal.

7. A circuit for receiving an external input comprising:
   an input buffer having an input coupled to receive an external input signal and an output coupled to generate a buffered input signal in response to the external input signal, wherein the input buffer is coupled to receive power from an external power supply;
   a latch coupled to receive the buffered input signal and generate a latched output signal;
   means coupled to the input buffer and responsive to the latched output signal for generating a control signal for a preselected duration after the latched output signal changes state; and
   means coupled to the input buffer for selectively de-coupling the input buffer from the external power supply in response to the control signal.

8. The circuit of claim 7 wherein the means for generating the control signal further comprises:
   a delay line coupled to the latched output signal and having an output providing a delayed signal; and
   a comparison circuit coupled to both the latched output signal and the delayed signal for generating the control signal.

9. The circuit of claim 8 wherein the comparison circuit generates a first binary state when both the latched output signal and the delayed signal have the same binary state and generates a second binary state when the latched output signal and the delayed signal have opposite binary states.

10. The circuit of claim 7 wherein the means for selectively de-coupling further comprises:
    a first switch coupled between the input buffer and the external power supply, the first switch having a control electrode for receiving the control signal; and a second switch coupled between the input buffer and the external power supply, the second switch having a control electrode for receiving the control signal.

11. The circuit of claim 7 wherein the means for generating a control signal for a preselected duration comprises:
   a delay line coupled to the latched output signal, the delay line providing a delayed output signal;
   an exclusive-or gate coupled to receive as inputs both the delayed output signal and the latched output signal, the exclusive-or gate having an inverting output providing the control signal.

12. An integrated circuit with noise immunity comprising:
   a first power supply bus;
   a second power supply bus;
   an input/output (I/O) circuit having an input node for receiving an input signal, an output node for providing an output signal, and power nodes for coupling to the first power supply bus and the second power supply bus; and
   a control circuit within the input/output circuit for selectively disabling changes in the output signal on the output node for a preselected time period after a change in state of the output signal, wherein the control circuit further comprises:
   a delay circuit coupled to the output node of the I/O circuit;
   a combinatorial logic circuit having a first input (A) coupled to the delay circuit and a second input (B) coupled to the output node of the I/O circuit, the combinatorial logic circuit generating an output $A\overline{B}+\overline{A}B$; and
   an inverter coupled to invert the output of the combinatorial logic circuit, wherein the output of the combinatorial logic circuit together with its inverse form a control signal used to selectively latch the output signal.

13. A method for receiving a signal in an integrated circuit comprising:
   amplifying the received signal;
   coupling the amplified signal to a latch;
   latching the amplified signal;
   de-coupling the amplified signal from the latch in response to a change in state of the latched signal; and
   recoupling the amplified signal to the latch after a preselected duration of time.

14. The method of claim 13 wherein the step of de-coupling comprising disabling an amplifier providing the amplifying function.

15. A method for receiving a signal in an integrated circuit comprising:
   amplifying the received signal;
   coupling the amplified signal to a latch;
   latching the amplified signal;
   generating a delayed latched amplified signal that is delayed by a preselected duration of time;
   comparing the delayed latched amplified signal to the latched amplified signal;
   in response to the comparing step, de-coupling the amplified signal from the latch when the delayed latched amplified signal differs from the latched amplified signal; and
   in response to the comparing step, re-coupling the latched amplified signal to the latch when the delayed latched amplified signal is substantially the same as the latched amplified signal.

* * * * *

UNITED STATES PATENT AND TRADEMARK OFFICE
CERTIFICATE OF CORRECTION

PATENT NO. : 6,037,827
DATED : March 14, 2000
INVENTOR(S) : David Fisch

It is certified that error appears in the above-identified patent and that said Letters Patent is hereby corrected as shown below:

Column 8, line 11, change "de-coupling comprising disabling" to --de-coupling comprises disabling--

Column 8, line 22, change "step, de-coupling" to --step de-coupling--

Column 8, line 26, change "step, re-coupling" to --step re-coupling--

Column 8, line 26-27, change "the latched amplified" to --the amplified--

Signed and Sealed this

Twenty-fourth Day of April, 2001

Attest:

NICHOLAS P. GODICI

Attesting Officer

Acting Director of the United States Patent and Trademark Office